United States Patent [19]

Lee et al.

[11] Patent Number: 4,581,318

[45] Date of Patent: Apr. 8, 1986

[54] N-ALKYNYL POLYVINYLPYRIDINIUM RESISTS HAVING ELECTRON AND DEEP U.V. SENSITIVITY

[75] Inventors: Kang I. Lee, Framingham; Harriet Jopson, Weston, both of Mass.

[73] Assignee: GTE Laboratories Incorporated, Waltham, Mass.

[21] Appl. No.: 596,282

[22] Filed: Apr. 3, 1984

[51] Int. Cl.$^4$ ................................................ G03C 1/68
[52] U.S. Cl. ..................................... 430/270; 430/287; 430/276; 525/327.1; 526/263; 522/149; 522/151
[58] Field of Search ............... 430/270, 287, 296, 326; 526/263; 525/327.1; 204/159.14, 159.22

[56] References Cited

U.S. PATENT DOCUMENTS 3,936,429  2/1976  Seoka et al. .
4,031,271  6/1977  Bush ................................... 430/296
4,065,414 12/1977  Seita et al. .......................... 526/263
4,312,935  1/1982  Engler et al. .
4,312,936  1/1982  Engler et al. .
4,338,392  7/1982  Engler et al. .

OTHER PUBLICATIONS

King, H. N. G., "Electron Lithography", *Solid State Technology*, Feb. 1982, pp. 102–105.
Piwczyk, B. P., Williams, A. E., "Electron Beam Lithography for the 80s" *Solid State Technology*, Jun. 1982, pp. 74–82.
Thompson, L. F., "Design of Polymer Resists for Electron Lithography" *Solid State Technology*, Jul. 1974, pp. 27–28.
Thompson, L. F. and Kerwin, R. E., "Polymer Resist Systems for Photo- and Electron Lithography", *Polymer Resist Systems*, pp. 267–281 (1976).

*Primary Examiner*—Jack P. Brammer
*Attorney, Agent, or Firm*—Hamilton, Brook, Smith and Reynolds

[57] ABSTRACT

N-alkynyl polyvinylpyridinium resists, which are sensitive to both electrons and deep U.V., are disclosed.

5 Claims, No Drawings

N-ALKYNYL POLYVINYLPYRIDINIUM RESISTS HAVING ELECTRON AND DEEP U.V. SENSITIVITY

TECHNICAL FIELD

This invention is in the field of polymer chemistry and more specifically relates to polymers which are both electron- and deep U.V.-sensitive.

BACKGROUND ART

Currently, photo-optical lithographic systems are widely employed in the fabrication of circuit pattern images on semiconductor substrates. Photo-optical lithographic technology, however, is approaching its ultimate limit, the point beyond which resolution cannot be improved due to diffraction effects. It has long been known, nevertheless, that considerable potential device speed and power enhancement is possible if higher resolution and improved processing techniques become available for production use.

Several new technologies are being developed in efforts to provide higher resolution lithography. Among these is electron lithography, in which the generation of a pattern is achieved by exposing a resist to energetic electrons, as opposed to the photons employed in photo-optical lithography.

Electron-beam lithography is the subject of extensive research efforts because of its unique combination of flexibility, resolution and alignment accuracy. An important element of this flexibility is the capability of fabricating devices without using physical masks, allowing design changes to be implemented and evaluated with minimum delay.

Among the first materials evaluated for use as electron resists were commercially available photo-optical resists. These materials offered the advantages of being readily available and the processing details for such materials were well understood. Such materials were less than satisfactory as electron resist, however, due to deficiencies such as poor electron sensitivity, low contrast, inadequate resolution and sensitivity to ambient light. For example, polymethylmethacrylate is a conventional photo-optical resist which is electron-sensitive, but its electron sensitivity is relatively low. Low sensitivity causes the required exposure time to dominate the throughput of electron lithography systems.

Because of the above, much research has been directed to finding new materials which would be suitable for use as electron-beam resists. Many such candidates have been reported in the technical and patent literature. U.S. Pat. Nos. 4,312,935; 4,312,936; and 4,338,392, for example, disclose a new proposed class of electron-beam resists based on conducting organic charge transfer salts, such as halogen salts of tetrathiafulvalene and their selenium analogs.

U.S. Pat. No. 3,936,429 discloses the preparation and use of reactive polymers formed by reacting homopolymers or copolymers of vinyl pyridine or substituted vinyl pyridine with certain unsaturated compounds to produce quaternary salt-type functional polymers. The resulting polymers are stated to undergo a reduction in solubility when exposed to light, electron-beams, and in general, electromagnetic waves, particle rays, thermal radiation, etc. Unfortunately, these polymers have been found to have poor photo-sensitivity in the deep U.V. range.

In order to fabricate complex integrated circuits at the lowest possible costs, it is desirable to combine photo-optical and electron-beam lithographic techniques in so-called hybrid lithography. This allows use of known photo-optical resists using established, inexpensive procedures for those steps in which the resolution of electron-beam lithography is not required. The process can be completed using electron-beam lithography to achieve submicron resolution where needed. However, in order to use hybrid lithography, resists are needed which have good sensitivity to electrons and light.

DISCLOSURE OF THE INVENTION

This invention relates to Applicants' discovery that vinylpyridine polymers can be quaternized with alkynyl halides to produce polymers which are sensitive to electrons and deep U.V. light. Thus, these polymers can be employed in resists for photo-optical lithography, electron-beam lithography, or a combination of photo-optical and electron-beam lithography. Indeed, exposure to deep ultraviolet light in photo-optical lithographic techniques does not result in destruction of the electron-beam sensitivity for these polymers.

BEST MODE FOR CARRYING OUT THE INVENTION

The vinylpyridinium polymers of this invention contain repeating units which can be represented by the following general formula:

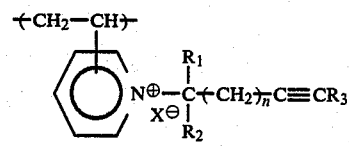

In this formula, n is a number of from 0 to 12; $R_1$ and $R_2$ are individually selected from hydrogen and $C_1$-$C_6$ alkyl; $R_3$ is hydrogen or a $C_1$-$C_{20}$ alkyl; and $X^\ominus$ is a negative counterion for the quaternized nitrogen atom. Preferably, $X^\ominus$ is a halogen atom, such as bromine, chlorine or iodine, or a monovalent halide ion such as $PF_6^\ominus$ or $BF_4^\ominus$.

These polymers can be prepared by reacting poly(vinylpyridines) with alkynyl halides. The following reactions, in which x represents the number of repeating vinyl pyridine units in the starting polymer, y represents the number of repeating vinyl pyridine units in the product polymer, and z represents the number of quaternized vinyl pyridinium units in the product, are illustrative:

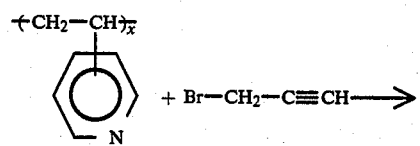

-continued

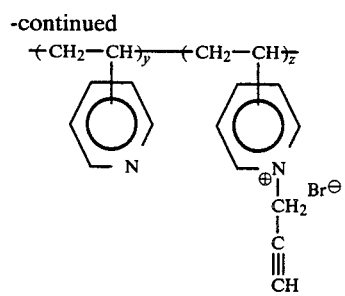

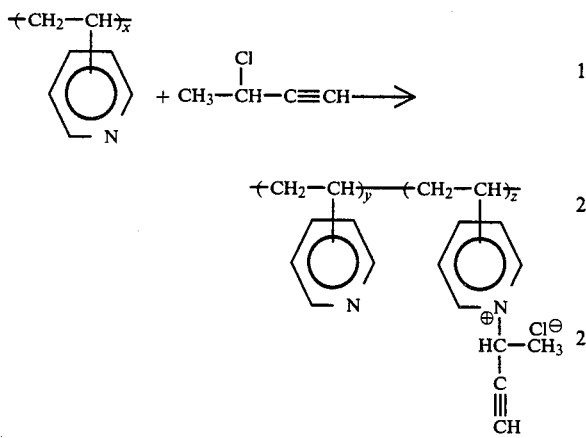

The vinylpyridine units are, of course, randomly quaternized in these reactions.

The degree of pyridine units having quaternized nitrogen atoms in the polymer is determined by the molar ratio between the reactants. In order to obtain a significant increase in the photo-sensitivity of the polymer, at least 3 mole percent of the vinyl pyridine groups should contain quaternized nitrogen atoms. In many cases, it is preferable to form a polymer containing higher amounts, such as about 10 mole percent.

The resulting polymers are sensitive to both electrons and deep U.V. light, i.e., having a wavelength below about 300 nanometers. Thus, they can be employed in photo-optical lithographic techniques, electron lithography techniques, or a combination of both. In such techniques, a resist film can be formed by coating the polymers onto a suitable substrate to form a resist film. The film can then be exposed to actinic radiation, such as ultraviolet light and/or an electron beam. After exposure, the film is washed with a solvent for unexposed areas to produce a negative resist image.

The resists of this invention are particularly suitable for fabricating microelectronic devices by applying a polymeric resist film to a semiconductor wafer. The resist is exposed to actinic radiation and then contacted with a solvent form the relief image thereon.

The resist formulation may contain agents in addition to the N-alkynyl polyvinylpyridinium salts of this invention. For example, sensitizing agents, thermal polymerization inhibitors, pigments, dyes, plasticizers, etc. may often be employed. Such additional agents are described in U.S. Pat. No. 3,936,429, the teachings of which are hereby incorporated by reference with regard to such additional agents.

The resist films can be formed by dissolving the polymer and other agents in a suitable solvent followed by coating the solution onto a substrate and allowing the solvent to evaporate. Suitable coating methods involve flow coating, roll coating, spray coating, dip coating, etc.

The invention will now be further and more specifically illustrated by the following examples.

EXAMPLE 1

QUATERNIZATION OF POLY(4-VINYL PYRIDINE) WITH 3-CHLORO-1-BUTYNE

One gram of poly(4-vinyl pyridine), $\overline{Mv}=90,000$, purified by repetitive precipitation from water/hexane, was dissolved in 30 ml of distilled nitromethane. 1.7 ml of 3-chloro-1-butyne was added dropwise with stirring. This provided a molar ratio of the poly(4-vinyl pyridine) to the butyne of 3 to 1. The color of this mixture turned dark yellow during reflux for one half hour. The mixture was cooled and then coagulated into hexane. Two layers formed with no solids. The hexane layer was decanted off and the product dried in an oven. NMR analysis and elemental analysis indicated that 10 mole percent of the pyridine units were quaternized.

EXAMPLE 2

COMPARATIVE EXAMPLE FOR PHOTOSENSITIVITY OF POLY(4-VINYL PYRIDINE) QUATERNIZED WITH 3-CHLORO-1-BUTYNE AND 3-CHLORO-1-BUTENE

This example presents the results of an experiment to compare the photosensitivity of the polymer prepared according to Example 1 with a similar polymer prepared by substituting 3-chloro-1-butene for the 3-chloro-1-butyne. The degree of quaternization was 10 mole percent in both polymers.

0.2 grams of each polymer was dissolved in a 50/50 volume percent mixture of methanol and water. The solutions were then spin coated onto the surface of silicon wafers and dried in an oven at 110° C. for 30 minutes. The resulting coatings were 6,000 Å in thickness.

Each coated wafer was then exposed by a model UVSL-25 Mineralite ® lamp at 254 nm spaced 30 cm from the wafers. The solubility of the films was checked with a 50/50 volume percent mixture of methanol and water until the films were found to be insoluble. The film prepared with the butyne was found to be insoluble after two seconds of exposure whereas the corresponding polymer prepared with the butene was not insoluble until after one minute of exposure.

EXAMPLE 3

PHOTOSENSITIVITY (DEEP UV) AND ELECTRON SENSITIVITY OF POLY(2-VINYL PYRIDINE) QUATERNIZED WITH 3-CHLORO-1-BUTYNE

Following the procedures of Example 1, poly(2-vinylpyridine) was quaternized with 3-chloro-1-butyne. 0.2 grams of the resulting polymer was dissolved in 10 ml of methanol/distilled water (50/50 by volume). A film of the polymer, approximately 6,000 Å units in thickness, was cast on a 2-inch silicon wafer by employing a conventional spinning technique. The coated wafer was baked for one hour at 110° C. before UV exposure. The coated wafer was exposed to a Mineralite ®UV Lamp at 254 nm spaced at a distance of 30 cm through the mask for 2 sec. The film was immersed into a solvent mixture consisting of methanol and distilled water (50/50 by volume) for 5 minutes in order to dissolve away any unexposed area. The thickness of the remaining film measured by a NANOSPEC-/AFT® film thickness monitor was found to be ~5,600 Å.

The remaining film was subsequently exposed to a 20 KV electron beam using a Jeol U3 scanning electron microscope. Exposure was done in rectangular patterns, with each rectangle having a different dose by varying scan time, beam current and magnification. The beam current was measured by means of a Faraday cup located in the instrument and a Keithley electrometer. The film was developed in a solvent mixture of distilled water and methanol (50/50 by volume) for one to five minutes. After drying the film in the oven for 30 minutes, the thickness was measured by a NANOSPEC-/AFT® film thickness monitor. The electron beam sensitivity of the film calculated at the dose level at which 80 percent of the film remained after development was found to be $1 \times 10^{-6}$ coul/cm$^2$.

EXAMPLE 4

FURTHER COMPARATIVE EXAMPLE

Using the procedures of Example 1 to prepare polymers, except substituting the reactants stated below, the method of Example 2 to determine photo-sensitivity, and the method of Example 3 to determine electron-beam sensitivity, a number of polymers were tested. The results are summarized in the table below, wherein 2 PVP represents poly(2-vinyl pyridine) and 4 PVP represents poly(4-vinyl pyridine).

| Polymer | Alkynes/Alkenes | Degree of Quaternization (mole %) | Deep UV Sensitivity (Time to Insolubilize) | E Beam Sensitivity (Coul/cm$^2$) |
|---|---|---|---|---|
| 2 PVP | 2-chloro-4-decyne | ~30 | 5 sec | $2.2 \times 10^{-6}$ |
| 2 PVP | propargyl chloride | ~20 | 5 sec | $3.2 \times 10^{-6}$ |
| 2 PVP | propargyl bromide | ~20 | 5 sec | $2.0 \times 10^{-6}$ |
| 4 PVP | 5-chloro-1-pentyne | ~30 | 3 sec | $1.0 \times 10^{-6}$ |
| 2 PVP | iodooctadecyne | ~22 | inactive | $5.0 \times 10^{-6}$ |
| 2 PVP | crotyl bromide (CH$_3$—CH=CHCH$_2$Br) | ~25 | 1 min | |
| 2 PVP | crotyl chloride (CH$_3$—CH=CHCH$_2$Cl) | ~20 | 1 min | |
| 2 PVP | allyl chloride (CH$_2$=CH—Cl) | ~25 | 3 min | |
| 2 PVP | allyl bromide (CH$_2$=CH—Br) | ~20 | 2 min | |

In general, acetylenic moieties (C≡C) are significantly more sensitive to deep UV (254 nm) than olefinic moieties (C=C).

Industrial Applicability

The invention described herein relates to resists formed from quaternized polymers of poly(vinylpyridines). Such resists are useful in photo-optical lithography and/or electron-beam lithography in the fabrication of microelectronic components.

Equivalents

Those skilled in the art will recognize, or be able to ascertain, using no more than routine experimentation, many equivalents to the specific embodiments of the invention described herein. Such equivalents are intended to be encompassed by the following claims.

We claim:

1. An electron- and photo-sensitive resist film having resist sensitivity to both electron and deep U.V. light having wavelength below about 300 nanometers, said resist film consisting essential of poly(vinyl pyridine) containing at least 3 mole percent vinyl pyridinium repeating units represented by the structural formula:

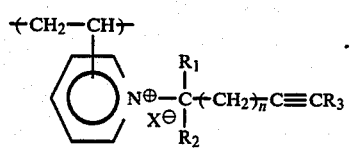

wherein:
n is a number from 0 to 12;
R$_1$ and R$_2$ are individually selected from hydrogen and C$_1$–C$_6$ alkyl;
R$_3$ is hydrogen or C$_1$–C$_{20}$ alkyl; and
X is a negative counterion for the quaternized nitrogen atom in the pyridinium ring.

2. A resist of claim 1 wherein R$_1$ is CH$_3$, R$_2$ and R$_3$ are H, and n=0.

3. A resist of claim 1 wherein R$_1$, R$_2$ and R$_3$ are each H and n is 0.

4. A resist of claim 1 wherein R$_1$ is CH$_3$, R$_2$ is H, R$_3$ is C$_5$H$_{11}$, and n=1.

5. A resist of claim 1 wherein R$_1$, Rhd 2 and R$_3$ are each H and n=2.

* * * * *